(12) United States Patent
Wan et al.

(10) Patent No.: US 7,016,163 B2
(45) Date of Patent: Mar. 21, 2006

(54) MAGNETIC FIELD SENSOR

(75) Inventors: Hong Wan, Plymouth, MN (US);
Lakshman S. Withanawasam, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 165 days.

(21) Appl. No.: 10/370,652

(22) Filed: Feb. 20, 2003

(65) Prior Publication Data

US 2004/0165319 A1 Aug. 26, 2004

(51) Int. Cl.
*G11B 5/39* (2006.01)
*G01R 33/02* (2006.01)

(52) U.S. Cl. ................................. 360/324.1; 324/252
(58) Field of Classification Search ................ 360/316
See application file for complete search history.

(56) References Cited

U.S. PATENT DOCUMENTS

| | | | |
|---|---|---|---|
| 3,054,978 A | 9/1962 | Schmidlin et al. | 338/24 |
| 3,569,895 A | 3/1971 | Fujisada | 338/14 |
| 3,949,346 A | 4/1976 | Makino et al. | 338/32 |
| 4,176,305 A | 11/1979 | Cuno | 318/653 |
| 4,506,220 A | 3/1985 | Sawada et al. | 324/252 |
| 4,847,584 A | 7/1989 | Pant | 338/32 |
| 4,949,039 A | 8/1990 | Grunberg | 324/252 |
| 5,206,590 A | 4/1993 | Dieny et al. | 324/252 |
| 5,247,278 A | 9/1993 | Pant et al. | 338/32 |
| 5,432,734 A | 7/1995 | Kawano et al. | 365/158 |
| 5,508,867 A | 4/1996 | Cain et al. | 360/113 |
| 5,561,368 A | 10/1996 | Dovek et al. | 324/252 |
| 5,589,768 A | 12/1996 | Ishiyama et al. | 324/207.21 |
| 5,617,071 A | 4/1997 | Daughton | 338/32 |
| 5,621,320 A | 4/1997 | Yokotani et al. | 324/252 |
| 5,644,456 A | 7/1997 | Smith et al. | 360/113 |
| 5,742,162 A | 4/1998 | Nepela et al. | 324/252 |

(Continued)

FOREIGN PATENT DOCUMENTS

EP 0 710 850 A2 5/1996

(Continued)

OTHER PUBLICATIONS

International Search Report PCT/US2004/005156.

(Continued)

*Primary Examiner*—A. J. Heinz
(74) *Attorney, Agent, or Firm*—McDonnell Boehnen Hulbert & Berghoff LLP (57) ABSTRACT

A spin valve GMR sensor configured in a bridge configuration is provided. The bridge includes two spin valve element pairs. The spin valve elements include a free layer, a space layer, a pinned layer, and a bias layer. The bias layer includes a first bias layer and a second bias layer. The first and second spin valve element pairs are formed on separate metal layers and a current pulse is applied to the metal layers, which sets the direction of magnetization in the pinned layer of the first pair of spin valve elements to be antiparallel to the direction of magnetization in the pinned layer of the second pair of spin valve elements. The same effect can be accomplished by making the pinned layer substantially thicker than the second bias layer in the first spin valve element pair and the pinned layer is substantially thinner than the second bias layer in the second spin valve element pair and applying a magnetic field to the first and the second spin valve element pairs.

7 Claims, 7 Drawing Sheets

U.S. PATENT DOCUMENTS

| | | | |
|---|---|---|---|
| 5,820,924 A | 10/1998 | Witcraft et al. | 427/130 |
| 5,869,963 A | 2/1999 | Saito et al. | 324/252 |
| 5,945,825 A | 8/1999 | Clemens | 324/252 |
| 5,952,825 A | 9/1999 | Wan | 324/252 |
| 5,999,378 A | 12/1999 | Saito et al. | 360/113 |
| 6,020,738 A * | 2/2000 | Van Den Berg et al. | 324/252 |
| 6,061,211 A | 5/2000 | Yoda et al. | 360/113 |
| 6,153,062 A | 11/2000 | Saito et al. | 204/192.2 |
| 6,175,296 B1 | 1/2001 | Tokunaga et al. | 338/32 |
| 6,243,288 B1 | 6/2001 | Ishikawa et al. | 365/158 |
| 6,282,068 B1 | 8/2001 | Pinarbasi | 360/324.11 |
| 6,313,973 B1 | 11/2001 | Fuke et al. | 360/324.1 |
| 6,427,349 B1 * | 8/2002 | Blank et al. | 33/356 |
| 2002/0085321 A1 | 7/2002 | Carey et al. | 360/324.11 |

FOREIGN PATENT DOCUMENTS

| | | |
|---|---|---|
| JP | 2001332783 | 11/2001 |

OTHER PUBLICATIONS

White, Robert L. "Giant Magentoresitance Materials and Their Potential as Read Head Sensors," IEEE Transactions on Magnetics, vol. 30, No. 2, Mar. 1994.

* cited by examiner

MAGNETIC FIELD SENSOR

FIELD

The present invention relates generally to giant magnetoresistive ("GMR") sensors. More specifically, the present invention relates to a GMR sensor in which a direction of magnetization of pinned layers in the GMR sensor may be easily fixed.

BACKGROUND

The ability to sense and measure a magnetic field is important in many areas. For example, magnetic sensors may be used for compassing, navigation, magnetic anomaly detection, and identifying position. As a result, magnetic sensors may be found in medical, laboratory, and electronic instruments; weather buoys; virtual reality systems; and a variety of other systems.

Such applications frequently employ magnetoresistive ("MR") sensors capable of sensing small magnetic fields. MR sensors are often formed using integrated circuit fabrication techniques and are typically composed of a nickel-iron (permalloy) thin film deposited on a silicon wafer, or other type of substrate, and patterned as resistive strips. The resistance of the strips varies with respect to an angle formed between a sensed magnetic field and current direction within the sensor. The strip resistance is maximized when the magnetic field and the current direction are parallel to each other.

During the manufacture of an MR sensor, the easy axis (the preferred direction of magnetization) is set to a direction along the length of the film to allow the maximum change in resistance of the strip. However, the influence of a strong magnetic could rotate the magnetization of the film, changing the sensor's characteristics. Following such changes, a strong restoring magnetic field can be applied to the sensor to restore, or set, the sensor's characteristics.

In certain designs, large external magnets can be placed adjacent to the sensor to set the sensor's characteristics. However, such an implementation may not be feasible when the MR sensor has already been packaged into a system. Particularly, some applications require several sensors within a single package to be magnetized in different directions. In such applications, instead of using large external magnets, individual coils may be wrapped around each sensor to restore the sensor's characteristics. Alternatively, current straps, also known as set-reset straps, may be used to restore the sensor's characteristics. The use of current straps in a magnetic field sensing device is discussed in U.S. Pat. No. 5,247,278 to Bharat B. Pant, assigned to the same assignee as the current application. U.S. Pat. No. 5,247,278 is fully incorporated herein by reference.

Another type of magnetic sensor is a giant magnetoresistive ("GMR") sensor. GMR sensors are typically employed in applications that require measurements of relatively small magnetic fields. GMR sensors may be manufactured using thin film technology and may include multiple layers of alternating ferromagnetic and non-magnetic materials. Generally, a GMR sensor includes two magnetic layers separated by a non-magnetic layer. The resistance of the magnetic layers is related to the direction of magnetization between the two magnetic layers.

Some of the structures currently being used to fabricate GMR elements include unpinned sandwich, antiferromagnetic multilayer, spin valve structures, and spin dependent tunnel structures.

The unpinned sandwich structure may include two magnetic layers separated by a conducting non-magnetic layer. For example, an unpinned sandwich structure may consist of two permalloy layers separated by a layer of copper.

An antiferromagnetic multilayer structure may consist of multiple repetitions of alternating conducting magnetic layers and non-magnetic layers. In this structure, each magnetic layer may have a direction of magnetization antiparallel to the direction of magnetization of the magnetic layers on either side.

Spin valve structures may include a pinned magnetic layer and a free magnetic layer, with a nonmagnetic layer, such as copper, located between the two magnetic layers. The pinned layer may have a fixed magnetization direction, while the free layer may rotate in the presence of an external magnetic field.

Spin dependent tunnel structures are similar to spin valve structures; however, the non-magnetic layer is a non-conductive material, such as an oxide, and current flows from one magnetic layer to another magnetic layer through a tunnel current in the non-conductive layer.

Magnetic field sensors using GMR elements are often fabricated in a Wheatstone bridge configuration. A Wheatstone bridge can be fabricated using four GMR elements, such as spin valves. One of the biggest challenges of fabricating a spin valve GMR sensor in a Wheatstone bridge configuration is producing two GMR element pairs that respond differently to the same external magnetic field. For a spin valve GMR sensor, the direction of magnetization of the pinned layers in adjacent legs of the bridge should be antiparallel in order to utilize the GMR ratio fully.

U.S. Pat. No. 5,617,071 entitled "Magnetoresistive structure comprising ferromagnetic thin films and intermediate alloy layer having magnetic concentrator and shielding permeable masses" discloses one approach to fix the direction of magnetization of the pinned layers in adjacent legs to be antiparallel by shielding one pair of Wheatstone bridge elements. By shielding opposing GMR elements with a highly permeable material, the shielded pair may not experience the effects of an applied magnetic field that rotates the direction of magnetization of the non-shielded pair. However, this approach limits the range of the output signal, reduces sensitivity of the sensor in half, and requires extra processing steps to fabricate the shielded layer.

U.S. Pat. No. 5,561,368 (hereinafter referred to as the '368 patent) entitled "Bridge Circuit Magnetic Field Sensor Having Spin Valve Magnetoresistive Elements Formed on Common Substrate" discloses another approach for producing two GMR element pairs that respond differently to the same external magnetic field. According to the '368 patent, four GMR spin valve elements are formed on the same substrate. The free layers of all four of the spin valve elements have their magnetization axes parallel to one another. The pinned layers of two spin valve elements have their magnetization axes antiparallel to the direction of magnetization of the pinned layers of the other two spin valve elements.

The magnetic field sensor in the '368 patent further includes an electrically conductive fixing layer (a current strap) formed on the substrate. The application of current through the fixing conductor during fabrication of the sensor fixes the direction of magnetization of two of the pinned layers to be antiparallel to the direction of magnetization of the other two pinned layers. While the current is applied to the fixing conductor, the sensor is first heated and then cooled.

The application of the current during the sensor fabrication may be difficult and not feasible, especially when many sensors are fabricated on a single wafer. Multiple power supplies may be required to supply the current to the fixing conductors or individual sensors may have to be linked. Thus, the methods described in the '368 patent may require a complicated manufacturing process. Furthermore, applying heat during the process may reduce the GMR ratio for the material.

Therefore, a need exists for a simple method of setting the magnetization directions in the pinned layers of spin valve GMR sensors configured in a Wheatstone bridge configuration.

BRIEF DESCRIPTION OF THE DRAWINGS

An exemplary embodiment of the present invention is described below with reference to the drawings, in which.

DETAILED DESCRIPTION

Figure 1:
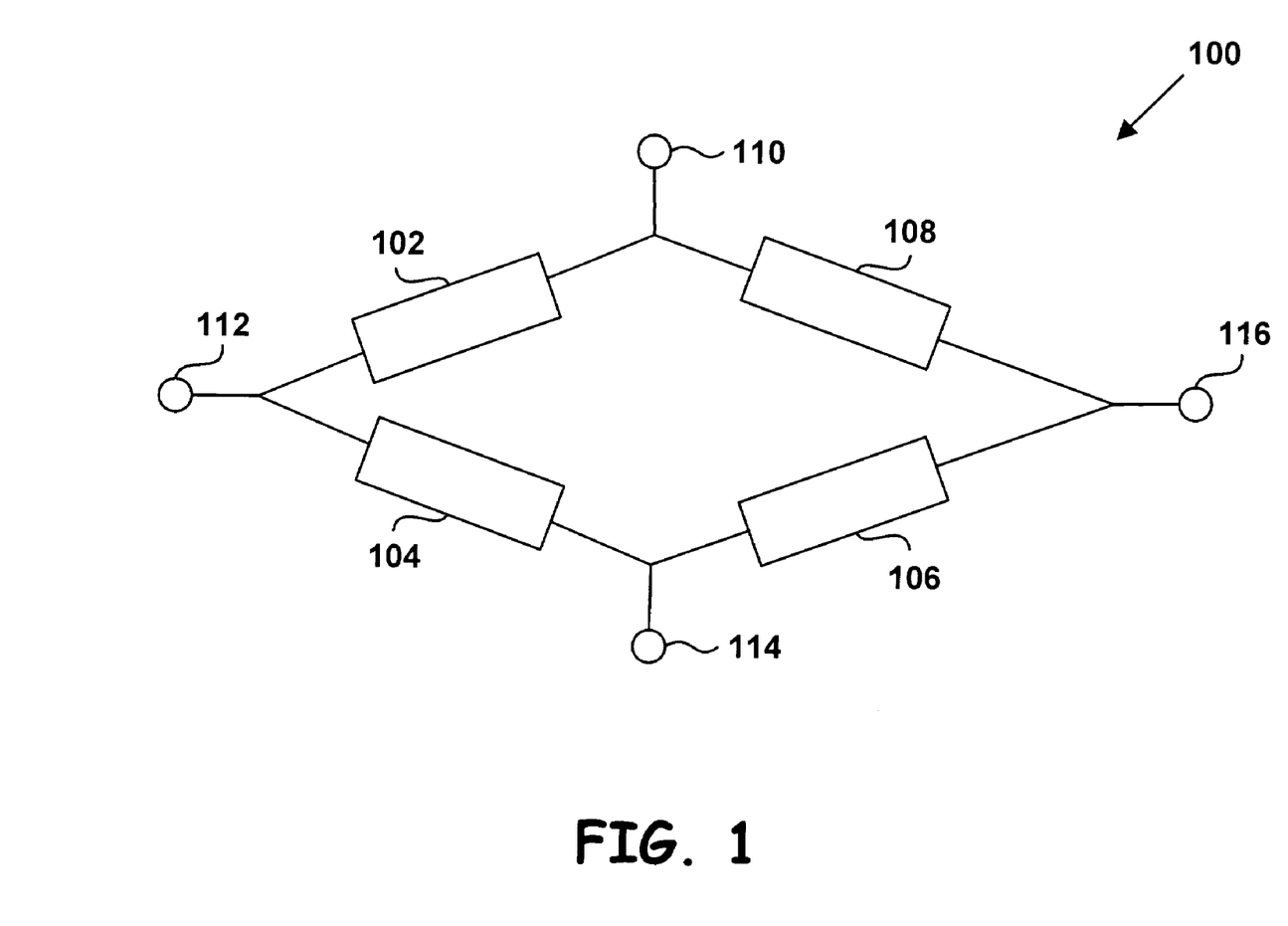
FIG. 1 is a schematic diagram of a GMR sensor, according to an exemplary embodiment.

FIG. 1 is a schematic diagram illustrating a giant magnetoresistive ("GMR") sensor 100, according to an exemplary embodiment. The GMR sensor 100 includes four spin valve elements 102, 104, 106, and 108 arranged in a bridge configuration, such as a Wheatstone bridge. Other bridge configurations may be used. The GMR sensor 100 may be packaged as an integrated circuit.

Spin valve elements 102–108 may be composed of GMR thin film layers as described below with reference to FIG. 2. Spin valve element 102 may respond to an external magnetic field substantially in the same manner as spin valve element 106. Spin valve element 104 may respond to an external magnetic field substantially in the same manner as spin valve 108.

Each of the spin valve elements 102–108 has a length and a width. Each spin valve element 102–108 may be arranged so that each length is parallel to lengths of the other spin valve elements. Further, each spin valve element 102–108 may be several hundred microns long and a few microns wide. The width of each spin valve element 102–108 may vary based on the GMR sensor's sensitivity requirements, while the length of each element may vary based on the GMR sensor's resistance and size requirements.

The GMR sensor 100 may include four terminals 110, 112, 114, and 116. As depicted in FIG. 1, terminal 110 is located between spin valve elements 102 and 108, terminal 112 is located between spin valve elements 102 and 104, terminal 114 is located between spin valve elements 104 and 106, and terminal 116 is located between spin valve elements 106 and 108. A power supply may be applied across terminals 110 and 114, which may result in an output of the bridge across terminals 112 and 116. Alternatively, the power supply may be applied across terminals 112 and 116, resulting in an output of the bridge across the terminals 110 and 114.

Figure 2:
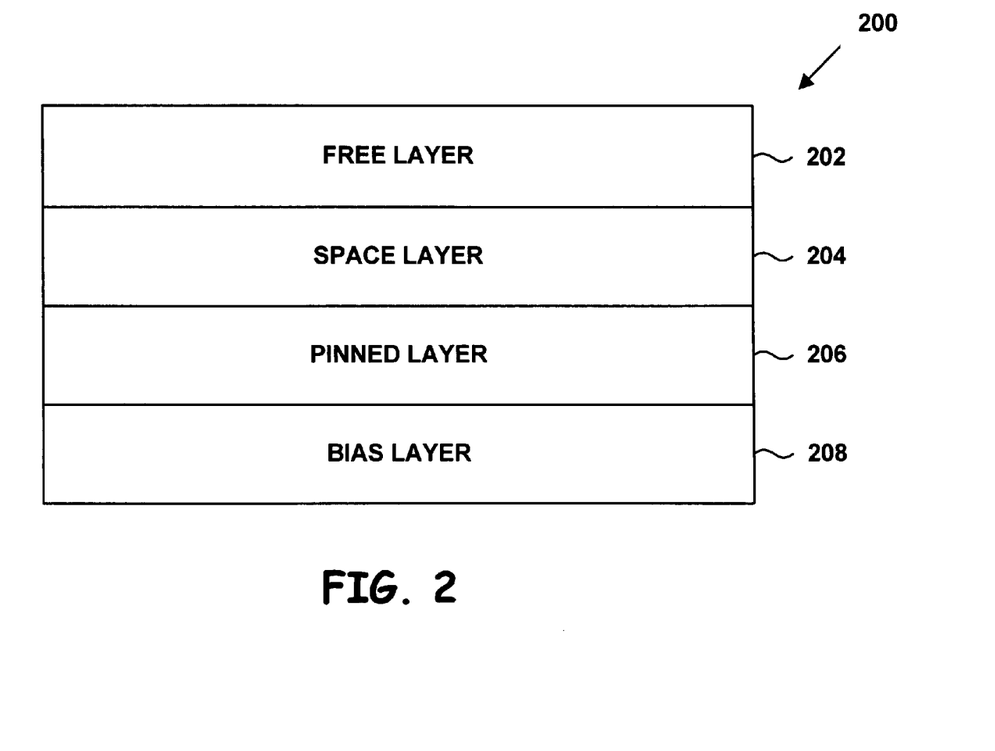
FIG. 2 is a cross sectional view of a spin valve element, according to an exemplary embodiment.

FIG. 2 is a cross sectional view of a spin valve element 200. Spin valve element 200 may be substantially the same as spin valve elements 102–108 depicted in FIG. 1. The spin valve element 200 may include a free layer 202, a space layer 204, a pinned layer 206, and a bias layer 208. As depicted in FIG. 2, the pinned layer 206 is located substantially above the bias layer 208, the space layer 204 is located substantially above the pinned layer 206, and the free layer 202 is located substantially above the space layer 204. The spin valve element 200 may include additional layers not shown in FIG. 2, such as a capping layer or a buffer layer.

The layers 202–208 of the spin valve element 200 may be deposited on a substrate using standard semiconductor deposition processes. For example, the layers 202–208 may be deposited using sputtering. The substrate may be composed of a semiconductor material such as silicon or gallium arsenide.

The layers 202–208 of the spin valve element 200 may be deposited in an external magnetic field. As a result, the free layer 202 and the pinned layer 206, which are both magnetic layers, may each possess a magnetic easy axis (a preferred direction of magnetization) due to their grain structure. The easy axis of the free layer 202 may be substantially parallel to the length of the spin valve element 200. The easy axis of the pinned layer 206 may be substantially perpendicular to the length of the spin valve element 200.

The free layer 202 may be composed of a ferromagnetic material, such as cobalt, iron, nickel, and their related alloys. In a preferred embodiment, the free layer may be permalloy. However, other ferromagnetic materials may be used to form the free layer. The free layer 202 may be free to rotate its direction of magnetization in response to an externally applied magnetic field.

The space layer 204 may be composed of a nonmagnetic material, such as copper (Cu). However, other nonmagnetic materials may be used to form the space layer. The space layer 204 may separate the two magnetic layers (e.g., the free layer 202 and the pinned layer 206). The space layer 204 may be thin enough so that the two magnetic layers 202, 206 may be coupled. For example, the space layer 204 may be approximately 1–4 nm. Accordingly, when one of the layers changes magnetic orientation, the other magnetic layer may also change its orientation.

The pinned layer 206 may also be composed of a ferromagnetic material. While a layer composed of cobalt (Co) or a CoFe alloy is preferred for the pinned layer, other ferromagnetic materials may be used. The bias layer 208 may fix the magnetization direction of the pinned layer 206. Accordingly, when the pinned layer 206 is exposed to an externally applied magnetic field, the direction of magnetization of the pinned layer 206 may remain in its preferred or fixed orientation.

The bias layer 208 may be composed of an antiferromagnetic material. The bias layer 208 may be composed of two layers, a first bias layer and a second bias layer. In a preferred embodiment, the first bias layer may be composed of ruthenium (Ru), while the second bias layer may be composed of cobalt (Co). The first bias layer may be located substantially above the second bias layer. If the pinned layer 206 is composed of cobalt, the pinned layer 206 and the bias layer 208 may form a "sandwich" with the ruthenium layer located between the two cobalt layers. The bias layer 208 may fix the magnetization direction of the pinned layer 206.

According to an exemplary embodiment, the thickness of the pinned layer 206 and the thickness of the cobalt layer in the bias layer 208 may be different. The thickness of the ruthenium layer in the bias layer 208 may be selected so that it provides antiferromagnetic coupling between the two adjacent cobalt layers. As a result the magnetizations of these two cobalt layers have opposite directions. For example, the thickness of the ruthenium layer may be approximately 4–7 Angstroms. In such an embodiment, the total magnetization from the two cobalt layers is very small, and thus, may not be easily influenced by an external magnetic field with low or moderate strength.

Figure 3:
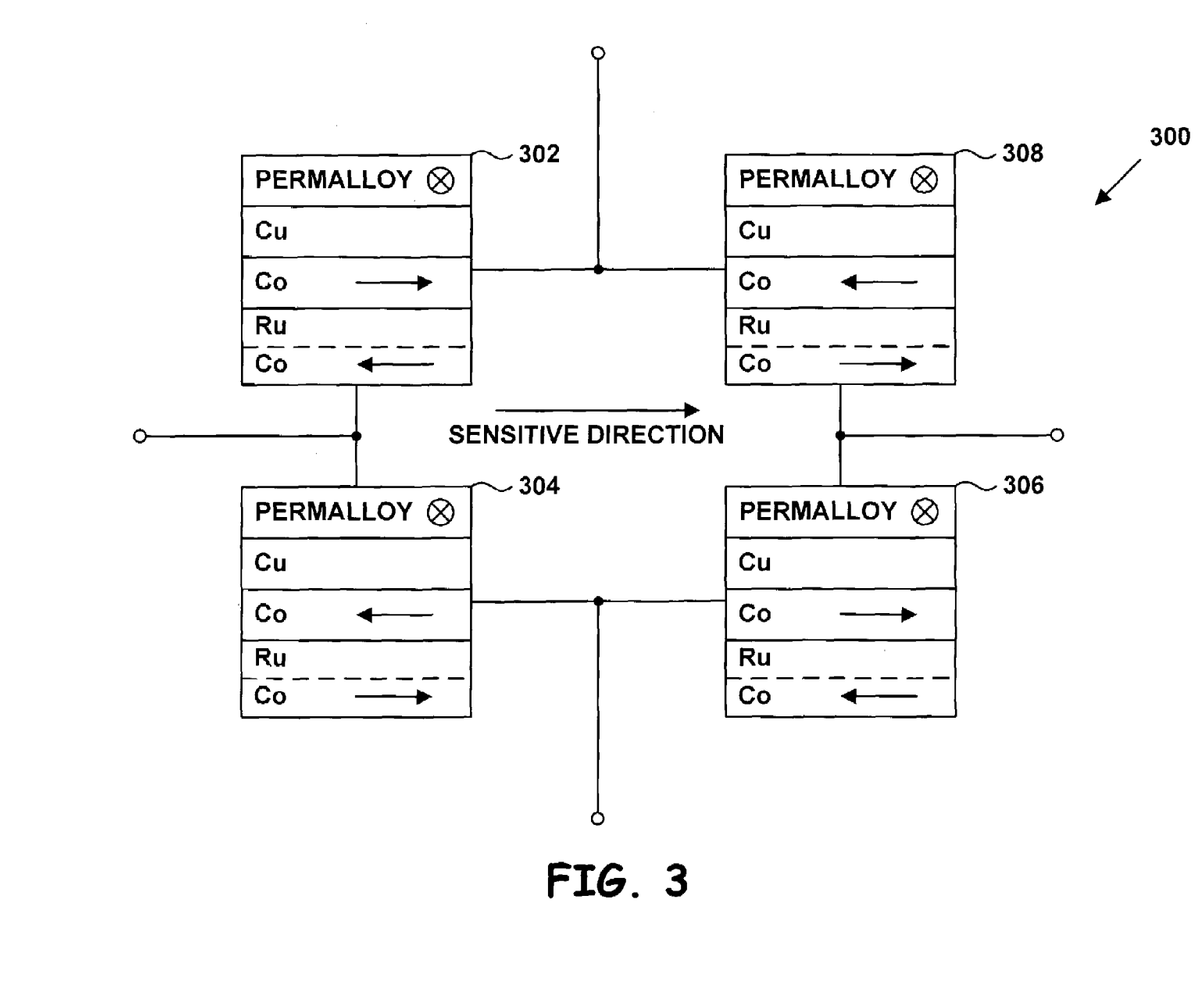
FIG. 3 is a cross sectional view of a GMR sensor, according to an exemplary embodiment.

FIG. 3 is a cross-sectional view of a GMR sensor 300. FIG. 3 depicts spin valve elements 302, 304, 306, and 308 in a bridge arrangement, similar to the configuration depicted in FIG. 1. Spin valve elements 302–308 are substantially the same as spin valve element 200 depicted in FIG. 2. In FIG. 3, the spin valve elements are shown with a free layer consisting of permalloy, a space layer consisting of copper (Cu), a pinned layer consisting of cobalt (Co), and a bias layer consisting of a ruthenium/cobalt (Ru/Co) layer. However, the spin valve element layers may be composed of different materials as discussed with reference to FIG. 2. FIG. 3 also depicts the direction of magnetization in each of the layers of the spin valve elements 302–308.

According to an exemplary embodiment, the direction of the magnetization of the pinned layer in one of the spin valve elements is antiparallel to the direction of the magnetization of the pinned layers in adjacent spin valve elements (e.g., compare element 302 with elements 304 and 308). The arrows in the pinned layers represent the direction of the magnetization in these layers. The direction of magnetization in each of the pinned layers may be critical to the operation of the GMR sensor 300. The layer of cobalt in the bias layer may have a magnetization in a direction opposite to that of the magnetization of the pinned layer in each of the spin valve elements 302–308.

In the absence of a magnetic field, the direction of magnetization in the free layers (permalloy layers) of each of the spin valve elements 302–308 may be the same. As depicted in FIG. 3, the free layers have a direction of magnetization into the page, which is perpendicular to the direction of the magnetizations in the two cobalt layers. This arrangement may provide the most linear response for the spin valve elements 302–308.

The bridge arrangement of the GMR sensor 300 may be balanced so that the spin valve elements 302–308 have equal resistance when not exposed to a magnetic field. If a voltage is applied across two opposite terminals of a balanced GMR sensor 300 that is not exposed to an external magnetic field, the differential output across the two other terminals will equal zero.

However, when the balanced GMR sensor 300 is exposed to a magnetic field, the free layers may rotate while the pinned layers remain fixed, resulting in a change of resistance of each of the spin valve elements 302–308. The resistance change may be proportional to the angle between the magnetization direction of the fixed pinned layer and the magnetization direction of the rotating free layer. This change in resistance may be detected and the magnitude and polarity of the applied magnetic field may be determined from the resistance change.

One of the biggest challenges of manufacturing a spin valve GMR sensor in a Wheatstone bridge or similar configuration is fabricating the pinned layers to have antiparallel magnetic directions in adjacent legs of the bridge. In one embodiment, applying a current pulse to an isolated metal layer may be used to set the direction of magnetization in the pinned layers.

Figure 4:
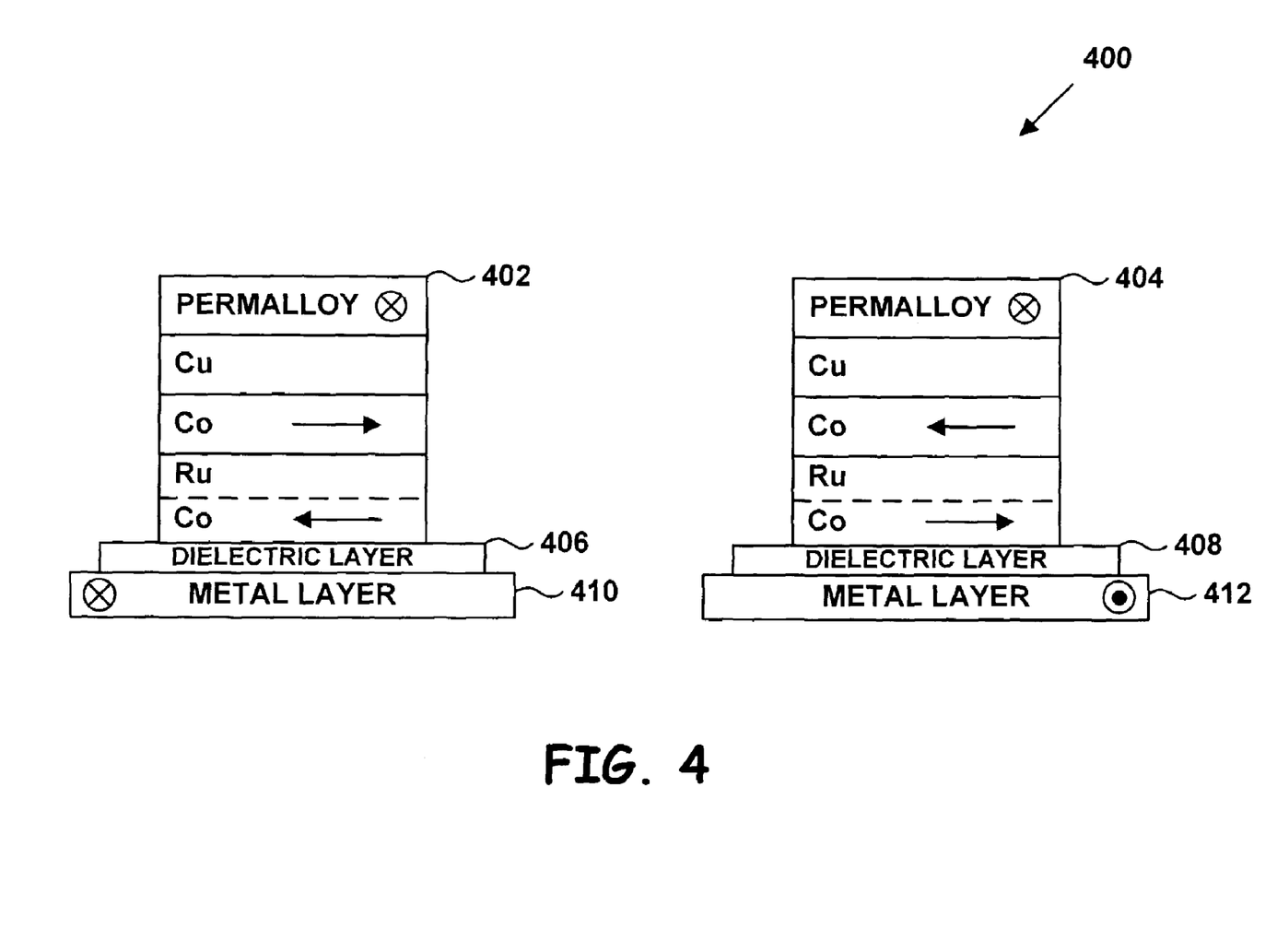
FIG. 4 is a cross sectional view of one half of a spin valve GMR sensor in a Wheatstone bridge configuration, according to an exemplary embodiment.

FIG. 4 is a cross sectional view of one half of a Wheatstone bridge configuration spin valve GMR sensor 400. It is understood that the GMR sensor 400 may have a second half substantially similar to the half depicted in FIG. 4. Spin valve elements 402 and 404 are substantially the same as spin valve elements 302 and 304 depicted in FIG. 3. The connections between spin valve elements 402 and 404 are not shown in FIG. 4 for the sake of simplicity, but it is understood that spin valve element 402 is connected to spin valve element 404 in such a manner that element 402 is located adjacent to element 404 in a bridge configuration. Accordingly, it is desirable for the direction of the magnetization in the pinned layer of spin valve element 402 to be antiparallel to the direction of the magnetization in the pinned layer of spin valve element 404.

Spin valve elements 402, 404 may be formed on dielectric layers 406, 408. The dielectric layers 406, 408 may be deposited on metal layers 410, 412. The metal layers 410, 412 may be deposited on a substrate. Standard semiconductor deposition processes may be used to deposit the metal layers 410, 412; the dielectric layers 406, 408; and the layers of the spin valve elements 402, 404.

The metal layers 410, 412 may be composed of copper, aluminum, or other conducting material. The dielectric layers 406, 408 may be composed of an insulating material, such as silicon dioxide or silicon nitride. The substrate may be composed of a semiconductor material such as silicon or gallium arsenide.

The metal layers 410, 412 may be connected to electrodes or other device terminals. As such, a source may be applied to the metal layers 410, 412 after device fabrication. For example, a current source may be applied to the metal layers 410, 412. The metal layers 410, 412 may be connected to the same current source, or each metal layer 410, 412 may be connected to a different current source.

Metal layer 410 may be located on the same substrate as metal layer 412. However, metal layer 410 may be electrically isolated from metal layer 412. Standard semiconductor isolation techniques may be used to provide the isolation. Accordingly, current flowing through metal layer 410 may not impact metal layer 412, and vice versa.

After the GMR sensor has been fabricated, a current pulse may be applied to each of the metal layers 410, 412. The current pulse may be characterized as having a large peak and a short width. The peak of the current pulse should be large enough to provide sufficient magnetic field to set the direction of magnetization in the spin valve elements 402, 404, while the width should be short enough to avoid generating too much heat. For example, the current peak may range from 100 milliamperes to several amperes and the pulse may be approximately 1 microsecond. However, other current pulses with different peaks and widths may be used.

Applying a current pulse to each of the metal layers 410, 412 may generate a localized magnetic field. The magnetic field generated by current flowing through metal layer 410 may affect spin valve element 402, but not spin valve element 404. Likewise, the magnetic field generated by current flowing through metal layer 412 may affect spin valve element 404, but not spin valve element 402.

The current flowing through metal layer 410 may be designed to flow in a direction opposite to that of the current flowing through metal layer 412. The opposite directions of current flow through the metal layers 410, 412 may generate the localized magnetic fields that cause spin valve elements 402, 404 to orient in opposite directions. In response to the pulse current, the layer of cobalt in the bias layer of spin valve element 402 may be fixed in a direction antiparallel to the layer of cobalt in the bias layer of spin valve element 404.

The current pulse may affect the total magnetization from the pinned and biasing layers. The total magnetization may be the difference between the magnetizations of the pinned and biasing layers because the moments are in opposite directions. The total magnetization may align to the magnetic field direction generated by the current pulse.

Figure 5:
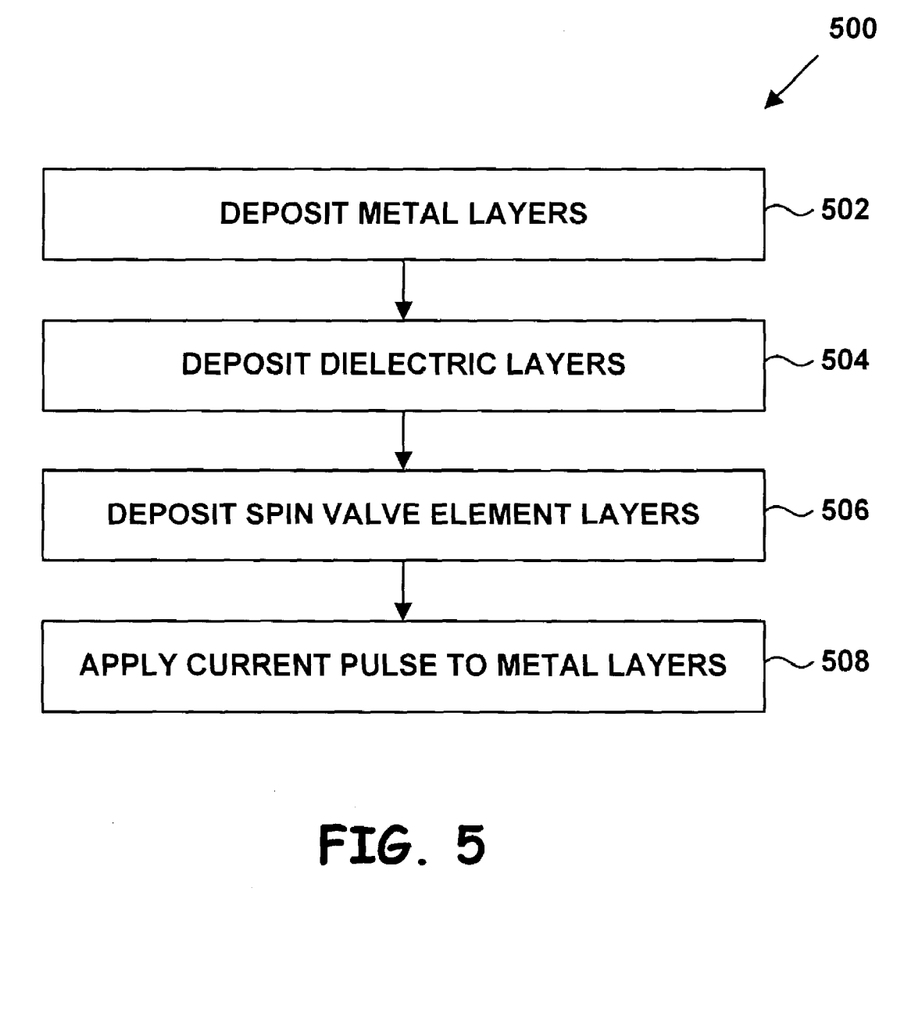
FIG. 5 is a flow chart diagram of a method of fabricating a GMR sensor, according to an exemplary embodiment.

FIG. 5 is a flow chart diagram of a method 500. The method 500 provides a method of fabricating a spin valve GMR sensor in a bridge configuration, such as a Wheatstone bridge. Block 502 specifies depositing metal layers. The metal layers may be deposited onto a substrate using standard semiconductor fabrication techniques. The metal layers may be composed of copper, aluminum, or other conducting material. A separate metal layer may be deposited for each spin valve element. Alternatively, a separate metal layer may be deposited for each pair of spin valve elements having the same direction of magnetization in their respective pinned layers. In yet another embodiment, a single metal layer may be deposited for all four spin valve elements in the GMR sensor.

Block 504 specifies depositing dielectric layers. The dielectric layers may be composed of an insulating material, such as silicon dioxide or silicon nitride. The dielectric layers may be deposited onto the metal layers using standard semiconductor fabrication techniques. Accordingly, there may be a separate dielectric layer for each spin valve element or for each pair of spin valve elements having the same direction of magnetization in their respective pinned layers.

Block 506 specifies depositing spin valve element layers. The spin valve element layers may include a free layer, a space layer, a pinned layer, and a bias layer. The spin valve element layers may be deposited onto the dielectric layers using standard semiconductor fabrication techniques. Four spin valve elements may be formed for each GMR sensor fabricated in a bridge configuration. The four spin valve elements may be formed on separate dielectric layers. Alternatively, one pair of spin valve elements may be formed on one dielectric layer and a second pair of spin valve elements may be formed on a second dielectric layer.

Block 508 specifies applying a current pulse to the metal layers. The current pulse may fix the direction of the magnetizations in the pinned layers to be in the same direction within each pair. Additionally, the current pulse may fix the direction of the magnetizations of the pinned layers in one pair to be antiparallel to the magnetizations of the pinned layers in the other pair. The current pulse may be applied to electrodes connected to the metal layers when the fabrication of the GMR sensor is substantially complete.

In an alternate embodiment, the spin valve elements may be deposited prior to depositing the dielectric layers and the metal layers. The dielectric layers may be located substantially between the spin valve element layers and the metal layers.

This method of making the pinned layers have antiparallel magnetic directions in the adjacent legs of a bridge may be advantageous because the current pulse is applied after the GMR sensor is fabricated. Applying a current to a current strap during fabrication may be very difficult, especially when there are many sensors on a single wafer. In addition, by limiting the width of the current pulse, degradation of the GMR sensor due to heat may be avoided. The resulting bipolar GMR sensor may be highly sensitive to wide range of magnetic fields.

Figure 6:
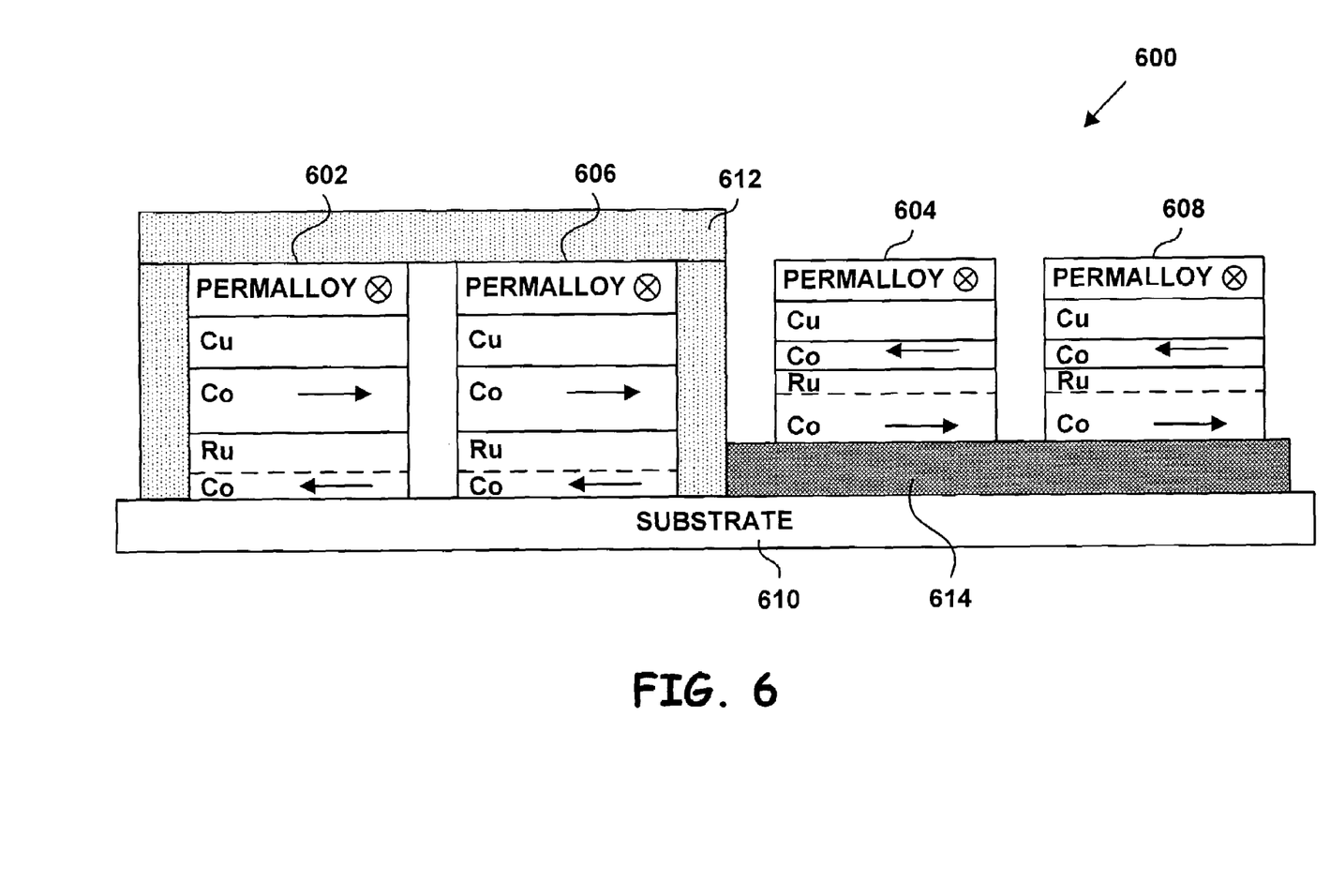
FIG. 6 is a cross sectional view of a GMR sensor, according to an exemplary embodiment.

FIG. 6 is a cross sectional view of a GMR sensor 600. The GMR sensor 600 includes two spin valve element pairs. Spin valve elements 602 and 606 form the first pair, while spin valve elements 604 and 608 form the second pair. The first pair of spin valve elements may have a pinned layer (cobalt layer) that is substantially thicker than the layer of cobalt in the bias layer. In contrast, the second pair of spin valve elements may have a pinned layer (cobalt layer) that is substantially thinner than the layer of cobalt in the bias layer. For example, the cobalt layer thickness may be in the range of 3 to 20 nanometers. Additionally, the difference in thickness between the two cobalt layers may be in the range of 0.4 to 10 nanometers. Other thicknesses may also be used.

The first spin valve element pair (spin valve elements 602 and 606) may be formed on a substrate 610. Spin valve elements 602 and 606 may be located diagonally in the bridge, such as spin valve elements 102 and 106 in FIG. 1. Each spin valve element in the first spin valve element pair may include a free layer, a space layer, a pinned layer, and a bias layer. When the layers of the first spin valve element pair are deposited, the pinned layer (cobalt layer) may be substantially thicker than the layer of cobalt in the bias layer.

A first dielectric layer 612 may be deposited substantially around the top and two sides of the first spin valve element pair, using standard semiconductor deposition processes. The first dielectric layer 612 may be composed of an insulating material, such as silicon dioxide or silicon nitride.

A second dielectric layer 614 may be deposited on the substrate 610 substantially adjacent to the first spin valve element pair. The dielectric layer 614 may be composed of an insulating material, such as silicon dioxide or silicon nitride. Alternatively, the first dielectric layer 612 may be deposited on the substrate 610 substantially adjacent to the first spin valve element pair, eliminating the need for the second dielectric layer 614.

The second spin valve element pair (spin valve elements 604 and 608) may be formed on the dielectric layer 614. Each spin valve element in the second spin valve element pair may include a free layer, a space layer, a pinned layer, and a bias layer. When the layers of the second spin valve element pair are deposited, the pinned layer (cobalt layer) may be substantially thinner than the layer of cobalt in the bias layer.

After fabricating GMR sensor 600, the GMR sensor 600 may be magnetized by a large external magnetic field. The magnetic field may be greater than 10 Gauss, depending on the film thickness. The magnetizations of the thicker layers of cobalt (e.g., the pinned layer of the first pair of spin valve elements and the layer of cobalt in the bias layer of the second pair of spin valve elements) may align in the same direction. The magnetizations of the thicker layers of cobalt may be substantially aligned in the direction of the applied magnetic field.

Through the coupling of the layer of ruthenium (Ru) in the bias layer, the magnetizations of the thinner cobalt layers may align in a direction opposite to that of the thicker cobalt layers. As a result, the orientation of the magnetization of the pinned layers in the first spin valve element pair may be antiparallel to the magnetization of the pinned layers in the second spin valve element pair.

Figure 7:
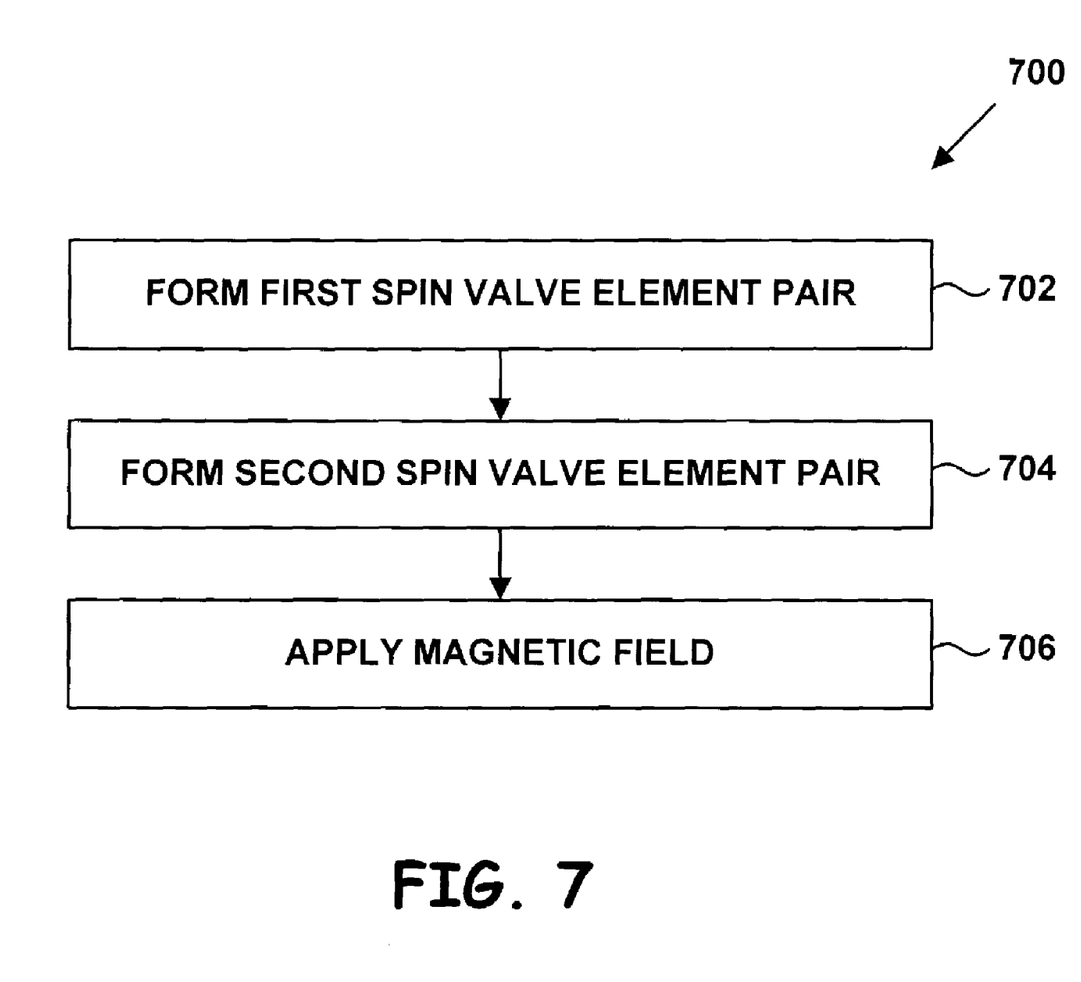
FIG. 7 is a flow chart diagram of a method of fabricating a GMR sensor, according to another exemplary embodiment.

FIG. 7 is a flow chart diagram of a method 700. The method 700 provides a method of fabricating a spin valve GMR sensor in a bridge configuration. For example, the bridge configuration may be a Wheatstone bridge. Block 702 specifies forming a first spin valve element pair. Standard semiconductor deposition processes may be used to deposit the various layers of the two spin valve elements onto a substrate. The layers of the first spin valve element pair may be deposited such that the layer of cobalt in the bias layers are thinner than the pinned layers, which may also be composed of cobalt. A dielectric layer may be deposited substantially around the top and two sides of the spin valve element pair.

Block 704 specifies forming a second spin valve element pair. A dielectric layer may be deposited on the substrate substantially adjacent to the first spin valve element pair. Standard semiconductor deposition processes may be used to deposit the various layers of the two spin valve elements onto the dielectric layer located substantially adjacent to the first spin valve element pair. The layers of the second spin valve element pair may be deposited such that the layer of cobalt in the bias layers are thicker than the pinned layers, which may also be composed of cobalt.

Block 706 specifies applying a magnetic field. The magnetic field may be applied to the first and second spin valve element pairs after they have been fabricated. The magnetic field may cause the magnetizations of the thicker layers of cobalt to align in the direction of the applied magnetic field. Through the coupling of the layer of ruthenium in the bias layer, the magnetizations of the thinner cobalt layers may align in a direction opposite to that of the thicker cobalt layers. As a result, the orientation of magnetization of the pinned layers in the first spin valve element pair may be antiparallel to the magnetization of the pinned layers in the second spin valve element pair.

This method of making the pinned layers have antiparallel magnetic directions in adjacent legs of a bridge may be advantageous because simple fabrication methods are used. Because the applied magnetic field is applied to both spin valve element pairs, fabricating a shield layer for half of the bridge may be unnecessary, which reduces the complexity of manufacturing the GMR sensor. The resulting bipolar GMR sensor may be highly sensitive to wide range of magnetic fields.

Methods 500 and 700 may also used for fabricating GMR sensors using spin dependent tunnel elements. A difference between the spin valve elements and a spin dependent tunnel element is the type of material used in fabricating the space layer. While a space layer in a spin valve may be composed of copper, the space layer in a spin dependent tunnel structure may be composed of an oxide. A change in the type of spacer material may not impact the effectiveness of the systems and methods described above with respect to a GMR sensor using spin valve elements.

It should be understood that the illustrated embodiments are exemplary only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A spin valve giant magnetoresistive sensor in a bridge configuration, comprising in combination:
   a first pair of spin valve elements formed on a first dielectric layer, wherein the first dielectric layer is formed on a first metal layer, wherein the first dielectric layer isolates the first pair of spin valve elements from the first metal layer, and wherein a current pulse applied to the first metal layer after fabrication of the sensor sets a direction of magnetization in the first pair of spin valve elements; and
   a second pair of spin valve elements formed on a second dielectric layer, wherein the second dielectric layer is formed a second metal layer, wherein the first dielectric layer isolates the second pair of spin valve elements from the second metal layer, and wherein a current pulse applied to the second metal layer after fabrication of the sensor sets a direction of magnetization in the second pair of spin valve elements.

2. The sensor of claim 1, wherein the first metal layer and the second metal layer are connected to electrodes.

3. The sensor of claim 2, wherein the current pulse is applied to the electrodes connected to the first metal layer and the second metal layer.

4. The sensor of claim 1, wherein the current pulse is applied for approximately 1 microsecond and has a peak greater than 100 milliamperes.

5. The sensor of claim 1, wherein the current pulse generates a first magnetic field in the first pair of spin valve elements and a second magnetic field in the second pair of spin valve elements.

6. The sensor of claim 5, wherein the first magnetic field is in a direction substantially opposite to that of the second magnetic field.

7. The sensor of claim 5, wherein the first magnetic field and the second magnetic field set a direction of magnetization in a pinned layer of the first spin valve element pair to be substantially antiparallel to a direction of magnetization in a pinned layer of the second spin valve element pair.

* * * * *